United States Patent
Kang

(10) Patent No.: US 6,870,785 B1
(45) Date of Patent: Mar. 22, 2005

(54) NONVOLATILE FERROELECTRIC MEMORY DEVICE HAVING MULTI-BIT CONTROL FUNCTION

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/742,395

(22) Filed: Dec. 22, 2003

(30) Foreign Application Priority Data

Sep. 8, 2003 (KR) ................................. 10-2003-0062759

(51) Int. Cl.$^7$ ................................................. G11C 7/14
(52) U.S. Cl. ................. 365/210; 365/230.03; 365/233; 365/189.07; 365/189.05; 365/203; 365/202; 365/196; 365/189.02; 365/209
(58) Field of Search ........................ 365/168, 145, 365/230.03, 233, 189.07, 189.05, 203, 202, 196, 195, 189.02, 210, 209

(56) References Cited

U.S. PATENT DOCUMENTS 6,587,367 B1 * 7/2003 Nishimura et al. ......... 365/145
6,721,200 B2 * 4/2004 Nishimura et al. ......... 365/145
6,724,646 B2 * 4/2004 Nishimura et al. ......... 365/145
6,728,128 B2 * 4/2004 Nishimura et al. ......... 365/145

* cited by examiner

Primary Examiner—Andrew Q. Tran
(74) Attorney, Agent, or Firm—Heller Ehrman White and McAuliffe LLP

(57) ABSTRACT

A nonvolatile ferroelectric memory device having a multi-bit control function can store and sense multi-bit data in a ferroelectric memory cell. In the memory device, a plurality of cell array blocks generates a plurality of different sensing critical voltages in a reference timing strobe interval. As a result, in different time intervals, the plurality of sensing critical voltages are compared with a plurality of cell data sensing voltages applied from a main bitline. A data register array unit stores a plurality of cell data applied from the plurality of cell array blocks in response to a plurality of read lock signals activated at different timings in different time intervals, respectively. Therefore, the plurality of data bits can be stored in a cell.

20 Claims, 16 Drawing Sheets

NONVOLATILE FERROELECTRIC MEMORY DEVICE HAVING MULTI-BIT CONTROL FUNCTION

BACKGROUND OF THE INVENTION

1. Field of the Invention

The present invention generally relates to a nonvolatile ferroelectric memory device having a multi-bit control function, and more specifically, to a technology for storing and sensing multi-bit data in a ferroelectric memory cell.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

In the conventional nonvolatile ferroelectric memory, a sensing reference voltage is set to have a proper level when cell data are sensed.

However, as a chip operation voltage of the FeRAM becomes lower, the level of the reference voltage to sense a cell also becomes lower. When the sensing voltage level of the cell data is low, a voltage margin between the sensing voltage and the reference voltage is reduced. As a result, it is difficult to determine data. Also, a sensing margin is reduced by a voltage level change of the reference voltage. Therefore, it is difficult to obtain a rapid operation speed of the FeRAM chip having a 1T1C (1transistor, 1capacitor).

As a semiconductor memory device becomes smaller, the size of cell also becomes smaller. As a result, a technology for storing a plurality of multi-bit data in a cell is required to improve the efficiency of the cell size.

SUMMARY OF THE INVENTION

Accordingly, it is an object of the present invention to generate different sensing critical voltages in a sense amplifier array unit to detect a plurality of data levels.

It is another object of the present invention to detect a plurality of data levels depending on a plurality of level sensing output voltages in different timing strobe intervals, thereby storing a plurality of data bits in a cell.

It is still another object of the present invention to store a plurality of read/written data through a register, thereby improving data access time.

In an embodiment, a nonvolatile ferroelectric memory device having a multi-bit function comprises a plurality of cell array blocks, a data register array unit and a common data bus unit. The plurality of cell array blocks generate a plurality of different sensing critical voltages in a reference timing strobe interval, and compare the plurality of sensing critical voltages with a plurality of cell data sensing voltages applied from a main bitline. Here, each of the plurality of cell array blocks comprises a nonvolatile ferroelectric memory. The data register array unit stores the plurality of bit data applied from the plurality of cell array blocks in different timing intervals, and converts a plurality of inputted bit data or the plurality of bit data into analog reference level signals. The common data bus unit, connected in common to the plurality of cell array blocks, controls data exchange between the plurality of cell array blocks and the data register array unit.

In another embodiment, a nonvolatile ferroelectric memory device having a multi-bit control function comprises a plurality of cell array blocks and a data register array unit. The data register array unit sequentially stores a plurality of cell data sensing voltages applied from the plurality of cell array blocks through a common data bus unit. Here, each of the plurality of cell array blocks comprises a sense amplifier array unit for generating a plurality of sensing critical voltages in response to a plurality of sensing enable signals having a predetermined time interval activated sequentially in a reference timing strobe interval, and for comparing the plurality of cell data sensing voltages applied from the common data bus unit with the plurality of sensing critical voltages.

DETAILED DESCRIPTION OF THE PREFERRED EMBODIMENTS

The present invention will be described in detail with reference to the accompanying drawings.

Figure 1:
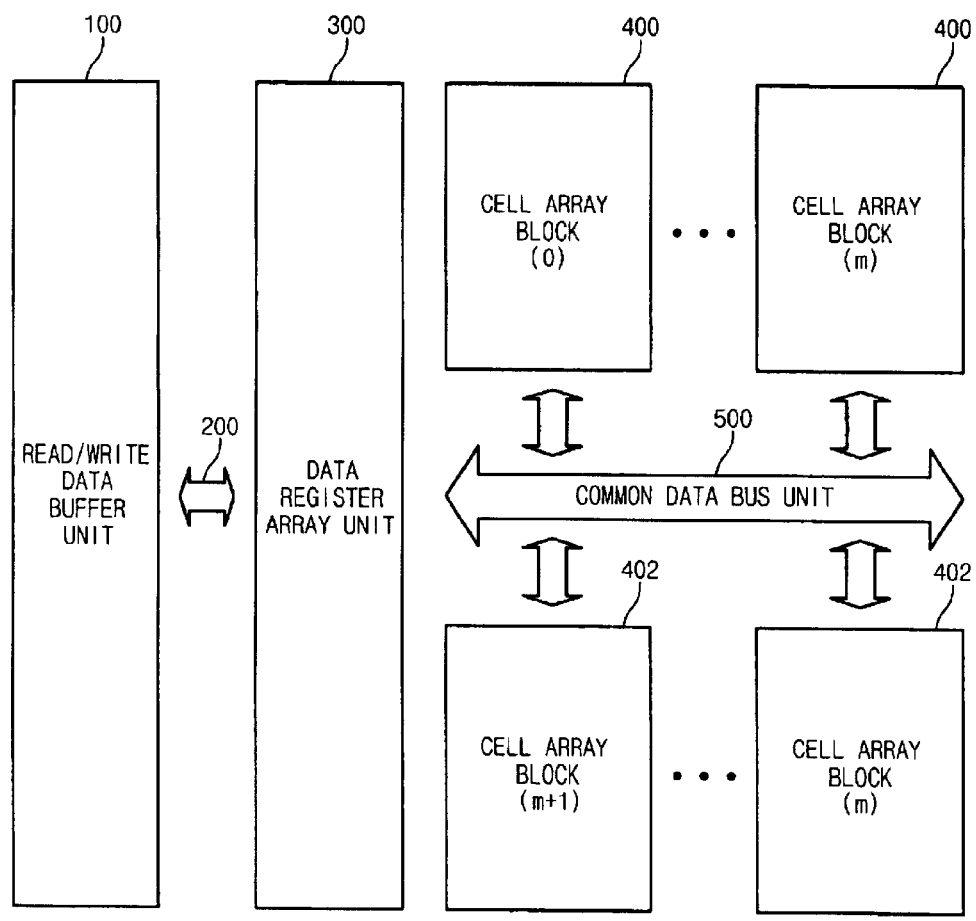
FIG. 1 is a diagram illustrating a nonvolatile ferroelectric memory device having a multi-bit control function according an embodiment of the present invention.

FIG. 1 is a diagram illustrating a nonvolatile ferroelectric memory device having a multi-bit control function according an embodiment of the present invention.

In an embodiment, the nonvolatile ferroelectric memory device comprises a read/write data buffer unit 100, a data buffer bus unit 200, a data register array unit 300, a plurality of cell array blocks 400 and 402 and a common data bus unit 500.

Each of the cell array blocks 400 and 402 comprises a plurality of bitline cell arrays each having a multi-bitline structure comprising sub bitlines and a main bitline. The multi-bitline structure cell array converts a sensing voltage of the sub bitline into current, and induces a main bitline sensing voltage.

Here, the plurality of cell array blocks 400 and 402 are symmetrically arranged on a basis of the common data bus unit 500. The plurality of cell array blocks 400 and 402 share the common data bus unit 500.

The read/write data buffer 100 is connected to the data register array unit 300 through the data buffer bus unit 200. The data register array unit 300 determines data "high" and "low" based on when a voltage level of data passes a sensing critical voltage in sensing data of the common data bus unit 500.

In a read mode, data read from the cell array blocks 400 and 402 are stored in the data register array unit 300 through the common data bus unit 500. The read data stored in the data register array unit 300 are outputted into the read/write data buffer unit 100 through the data buffer bus unit 200.

In a write mode, input data inputted through the read/write data buffer unit 100 are stored in the read/write data register array unit 300 through the data buffer bus unit 200. The input data or read data stored in the data register array unit 300 are written in the cell array blocks 400 and 402 through the common data bus unit 500.

Figure 2:
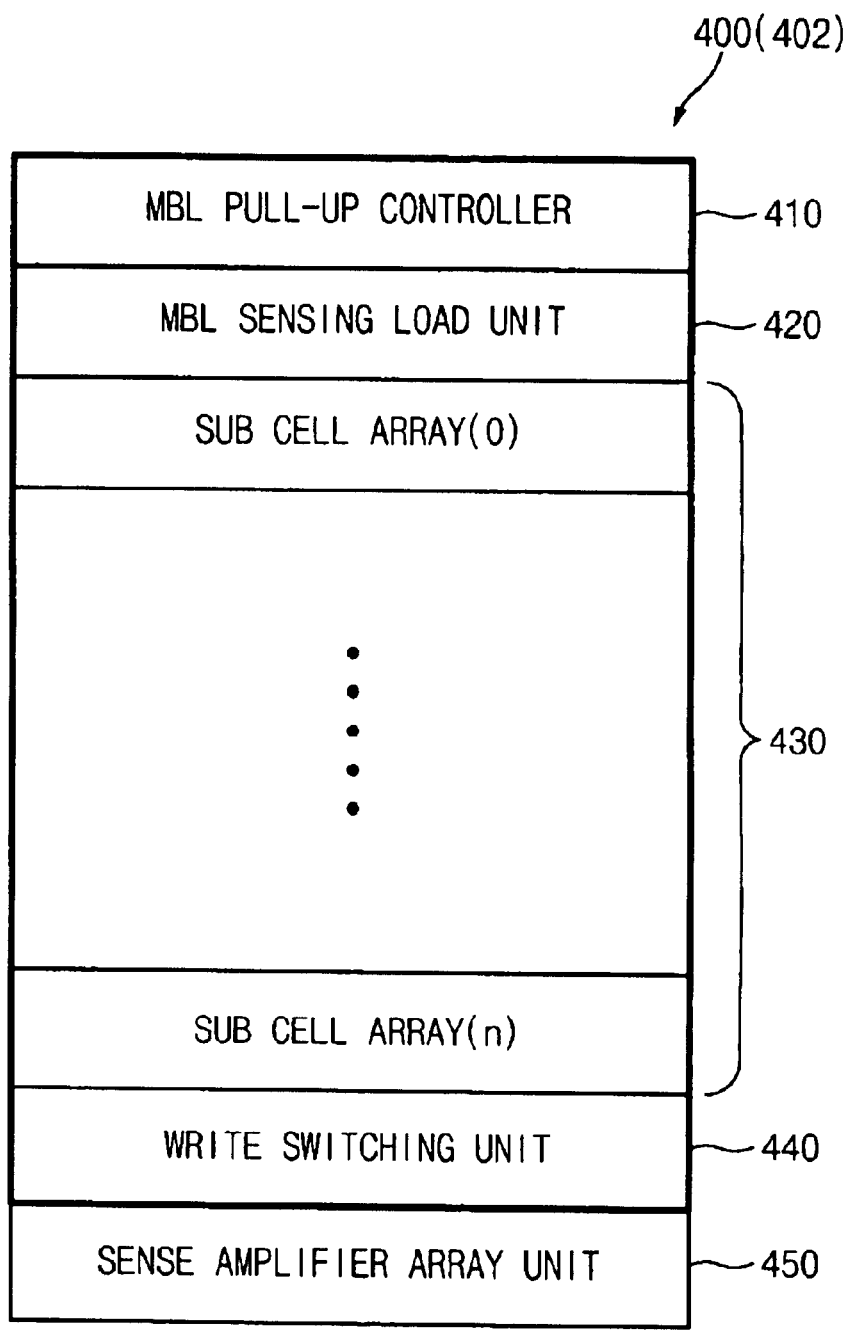
FIG. 2 is a block diagram of a cell array block of FIG. 1.

FIG. 2 is a block diagram of the cell array block 400 or 402 of FIG. 1.

The cell array block 400 comprises a main bitline (MBL) pull-up controller 410, a main bitline sensing load unit 420, a plurality of sub cell arrays 430, a write switching unit 440 and a sense amplifier array unit 450.

Here, main bitlines MBL of a plurality of sub cell arrays 430 are connected to the sense amplifier array unit 450 through the write switching unit 440, and the sense amplifier array unit 450 is connected to the common data bus unit 500.

Figure 3:
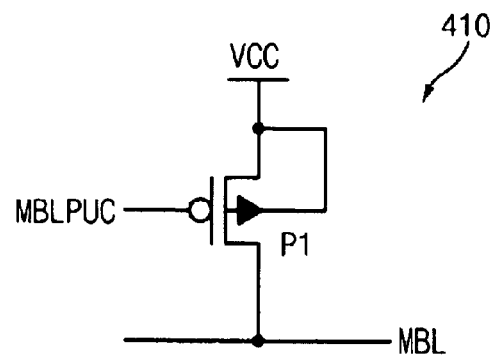
FIG. 3 is a circuit diagram of a main bitline pull-up controller of FIG. 2.

FIG. 3 is a circuit diagram of the main bitline pull-up controller 410 of FIG. 2.

The MBL pull-up controller 410 comprises a PMOS transistor P1 for pulling up a main bitline MBL in a precharge mode. The PMOS transistor P1 has a source connected to a power voltage VCC(or VPP) terminal, a drain connected to the main bitline MBL and a gate to receive a main bitline pull-up control signal MBLPUC.

Figure 4:
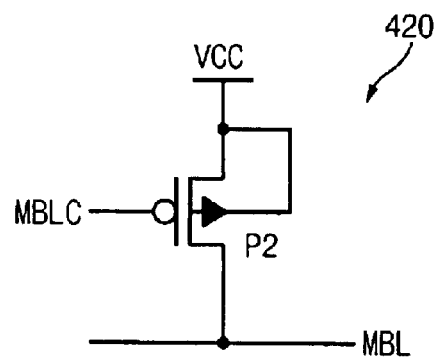
FIG. 4 is a circuit diagram of a main bitline sensing load unit of FIG. 2.

FIG. 4 is a circuit diagram of the main bitline sensing load unit 420 of FIG. 2.

The main bitline sensing load unit 420 comprises a PMOS transistor P2 for controlling sensing load of the main bitline MBL. The PMOS transistor P2 has a source connected to a power voltage VCC terminal, a drain connected to the main bitline MBL and a gate to receive a main bitline control signal MBLC.

Figure 5:
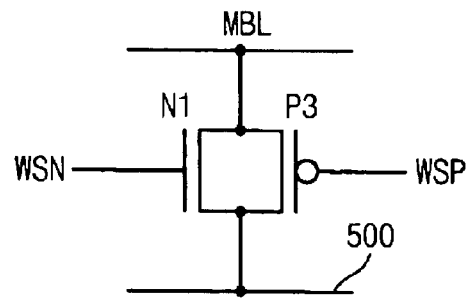
FIG. 5 is a circuit diagram of a write switching unit of FIG. 2.

FIG. 5 is a circuit diagram of the write switching unit 440 of FIG. 2.

The write switching unit 440 comprises an NMOS transistor N1 and a PMOS transistor P3. The NMOS transistor N1, connected between the main bitline MBL and the common data bus unit 500, has a gate to receive a write switching signal WSN. The PMOS transistor P3, connected between the main bitline MBL and the common data bus unit 500, has a gate to receive a write switching signal WSP.

Figure 6:
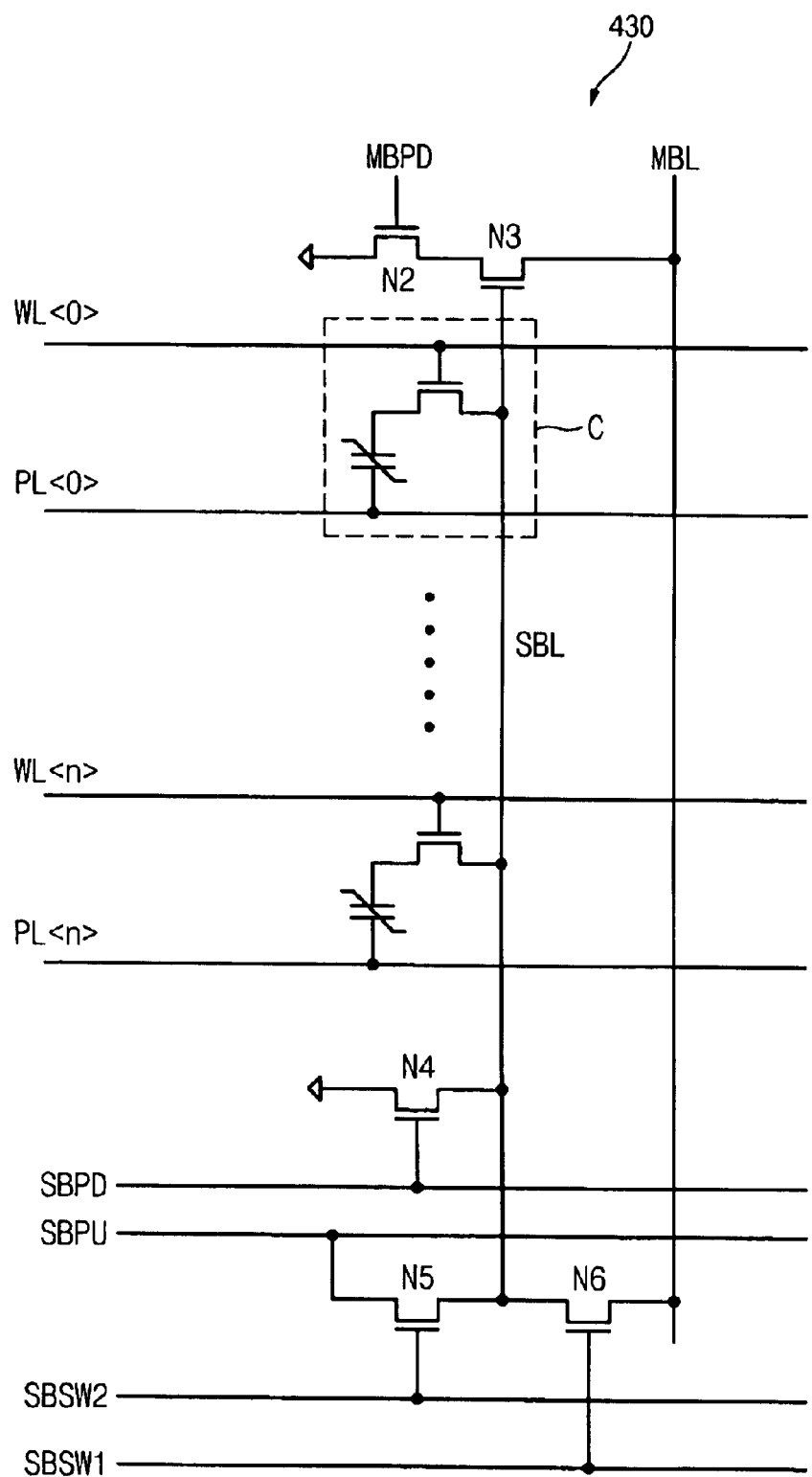
FIG. 6 is a circuit diagram of a sub cell array of FIG. 2.

FIG. 6 is a circuit diagram of the sub cell array 430 of FIG. 2.

Each main bitline MBL of the sub cell array 430 is selectively connected to one of a plurality of sub bitlines SBL. When a sub bitline selecting signal SBSW1 is activated, an NMOS transistor N6 is turned on, thereby activating a sub bitline SBL. One sub bitline SBL is connected to a plurality of cells C.

The sub bitline SBL is pulled down to a ground level in response to a sub bitline pull-down signal SBPD when an NMOS transistor N4 is turned on. The sub bitline pull-up signal SBPU is to control power supplied to the sub bitline SBL. In a low voltage, a voltage higher than the power voltage VCC is supplied to the sub bitline SBL.

An NMOS transistor N5 controls connection between a sub bitline pull-up signal SBPU terminal and the sub bitline SBL in response to a sub bitline selecting signal SBSW2.

An NMOS transistor N3, connected between an NMOS transistor N2 and the main bitline MBL, has a gate connected to the sub bitline SBL. The NMOS transistor N2, connected between a ground voltage terminal and the NMOS transistor N3, has a gate to receive a main bitline pull-down signal MBPD, thereby regulating a sensing voltage of the main bitline MBL.

Figure 7:
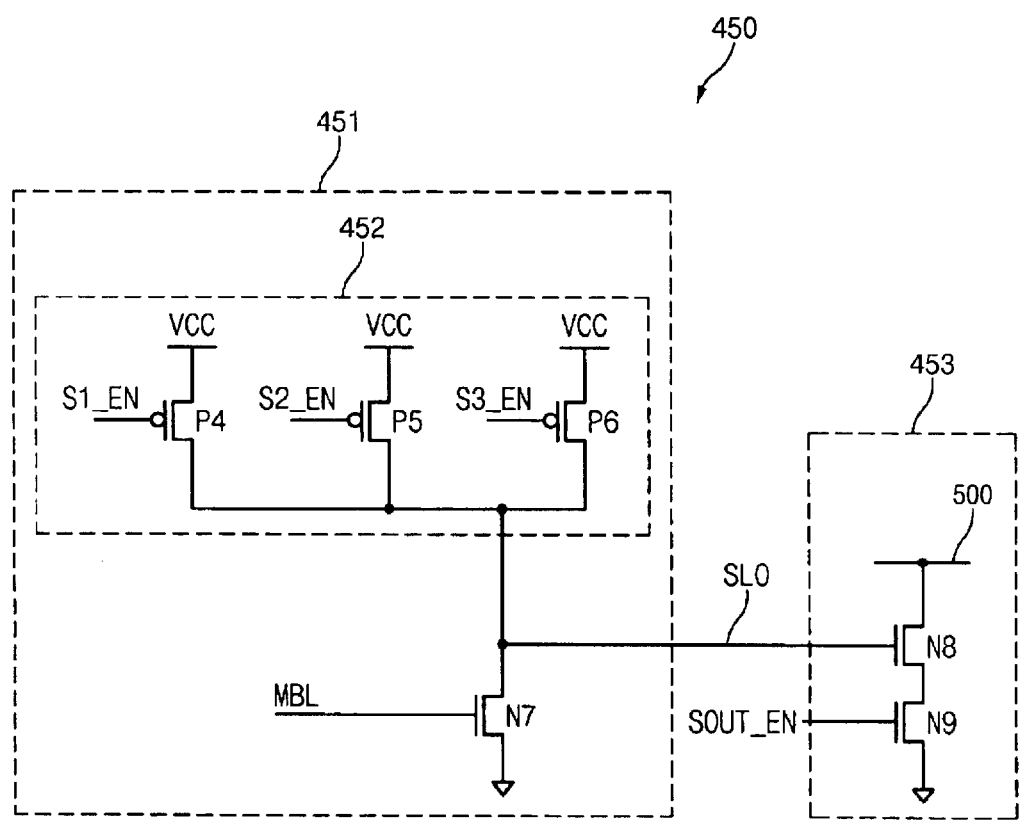
FIG. 7 is a diagram of a sense amplifier array unit of FIG. 2.

FIG. 7 is a diagram of the sense amplifier array unit 450 of FIG. 2.

The sense amplifier array unit 450 comprises a multi-level sensing unit 451 and a sensing output unit 453. The multi-level sensing unit 451 comprises a sensing voltage regulator 452 and an NMOS transistor N7. Here, the sensing voltage regulator 452 comprises PMOS transistors P4~P6 connected in parallel between the power voltage VCC terminal and a node SLO.

The PMOS transistor P4 is turned on when a sensing enable signal S1_EN is disabled, and outputs a detecting voltage of the node SLO. The PMOS transistor P5 is turned on when a sensing enable signal S2_EN is disabled, and outputs the detecting voltage of the node SLO. The PMOS transistor P6 is turned on when a sensing enable signal S3_EN is disabled, and outputs the detecting voltage of the node SLO. The sensing enable signals S1_EN~S3-EN for controlling the turn-on operation of the PMOS transistors P4~P6 are individually activated, and sequentially disabled in a predetermined time interval.

Channel resistance values of the PMOS transistors P4~P6 may be set identically or differently depending on voltage levels to be set.

The NMOS transistor N7, connected between the node SLO and the ground voltage terminal, has a gate connected to the main bitline MBL, and the amount of current flowing through the NMOS transistor N7 is controlled by a voltage of the main bitline MBL. As a result, a plurality of detecting voltage levels are generated by a ratio of the current applied to the node SLO from the sensing voltage regulator 452 and the current applied to the node SLO from the NMOS transistor N7.

When the main bitline MBL is over a critical voltage, the NMOS transistor N7 is turned on, and the node SLO becomes "low". When the main bitline MBL is below a critical voltage, the NMOS transistor N7 is kept turned off, and the node SLO becomes "high".

The sensing output unit 453 comprises NMOS transistors N8 and N9 connected in series between the common data bus unit 500 and the ground voltage terminal. The NMOS transistor N8 has a gate connected to the node SLO, and the NMOS transistor N9 has a gate to receive a sensing output enable signal SOUT_EN.

The NMOS transistor N9 is kept turned off in a normal mode. In the read mode, if the sensing output enable signal SOUT_EN is enabled, the NMOS transistor N9 is turned on. As a result, the voltage level of the common data bus unit 500 is determined depending on the voltage level of the node SLO.

That is, the common data bus unit 500 is maintained at a high level by a bus pull-up unit, and pulled down by the voltage level of the node SLO. When the voltage level of the node SLO is "high", the common data bus unit 500 is pulled down to a low level. On the other hand, when the voltage level of the node SLO is "low", the common data bus unit 500 is maintained at a high level.

Figure 8:
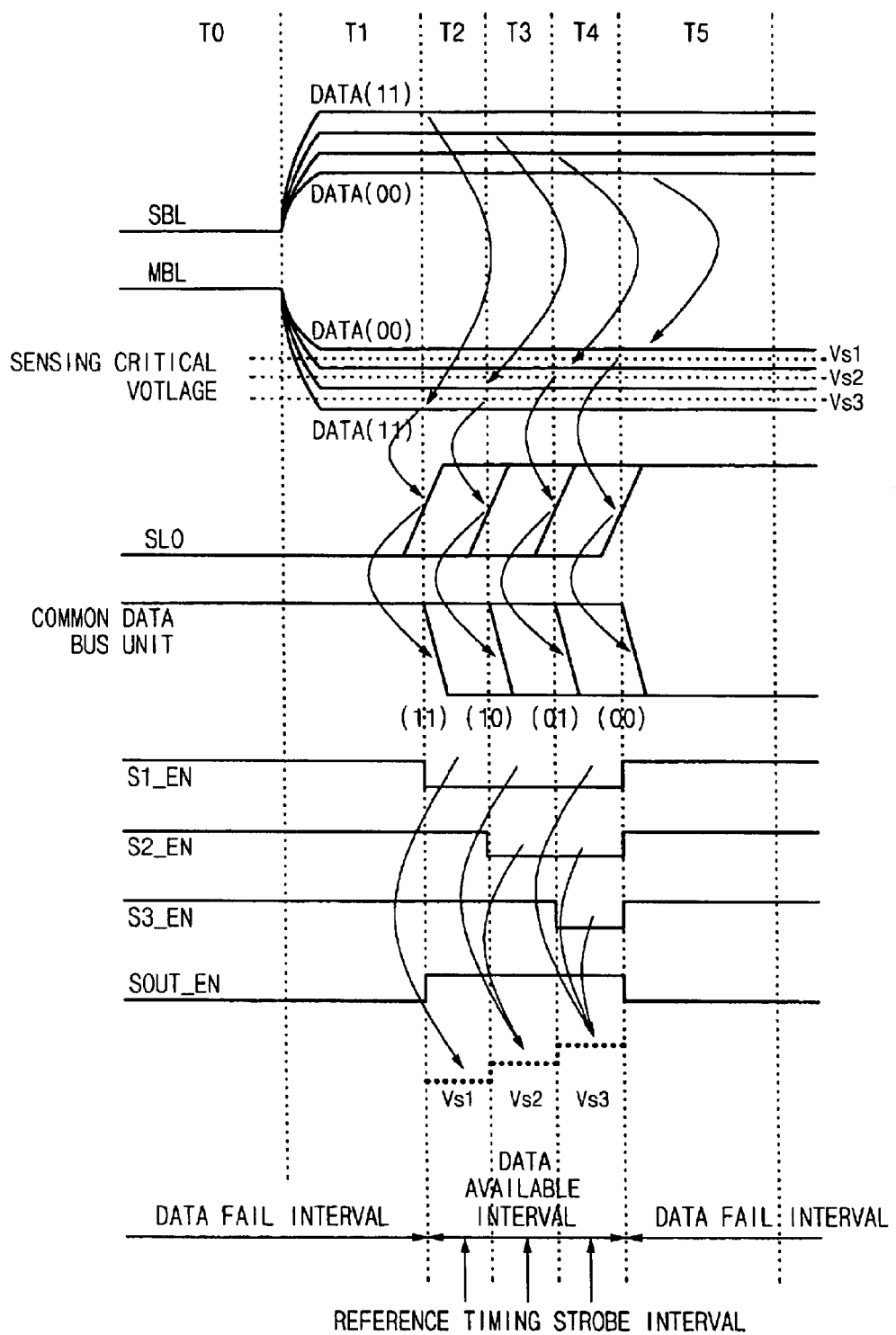
FIG. 8 is a timing diagram of a sense amplifier array unit of FIG. 7.

FIG. 8 is a timing diagram of the sense amplifier array unit 450 of FIG. 7.

In an interval T0, a wordline WL and a plateline PL are inactivated, and the main bitline MBL and the read data bus unit 400 are precharged to a high level. Here, the sub bitline SBL and the node SLO are precharged to a low level. The sensing enable signal S_EN and the sensing output enable signal SOUT_EN are at a disable state.

In an interval T1, the wordline WL and the plateline PL are activated to a high level. 4 level (2 bit) data are stored in a cell, and multi-data such as data 00, 01, 10 and 11 are applied to the sub bitline SBL and the main bitline MBL to sense voltage levels of the stored cell data.

In an interval T2, sensing critical voltages Vs1, Vs2 and Vs3 are differently set depending on activation of the PMOS transistors P1, P2 and P3. Then, the sensing output enable signal SOUT_EN becomes at a high level. Four sensing voltage levels of the main bitline MBL are compared and amplified with the three sensing critical voltages Vs1, Vs2 and Vs3 set by the sensing voltage regulator 452.

When the interval T2 starts, if the sensing enable signal S1_EN is disabled, the PMOS transistor P4 is turned on. As a result, the voltage level of the node SLO is determined on a basis of the sensing critical voltage Vs1 having the lowest level. When only the PMOS transistor P4 is activated and the main bitline MBL has the lowest voltage level, the sense amplifier array unit 450 can determine data 11 and 10.

When the interval T3 starts, if the sensing enable signal S2_EN is disabled, the PMOS transistors P4 and P5 are simultaneously activated. As a result, the voltage level of the node SLO is determined on a basis of the sensing critical voltage Vs2 having a middle level. When the PMOS transistors P4 and P5 are activated and the main bitline MBL has the middle level, the sense amplifier array unit 450 can determined data 10 and 01.

When an interval T4 starts, the sensing enable signal S3_EN is disabled, the PMOS transistors P4, P5 and P6 are simultaneously activated. As a result, the voltage level of the node SLO is determined on a basis of the sensing critical voltage Vs3 having the highest level. When the PMOS transistor P4, P5 and P6 are all activated and the main bitline MBL has the highest voltage level, the sense amplifier array unit 450 can determine data 00 and 01.

The multi-data determining intervals are set as different timing intervals depending on when the sensing enable signals S1_EN~S3_EN are disabled. During the reference timing strobe interval (T2~T4), the sensing output enable signal SOUT_EN is maintained at an enabled state. As a result, the voltage levels of determined data are outputted into the common data bus unit 500 depending on the voltage level of the node SLO.

When an interval T5 starts, the voltage level of the node SLO is enabled to a high level regardless of cell data. As a result, the voltage level of the common data bus unit 500 is disabled to a low level.

Figure 9:
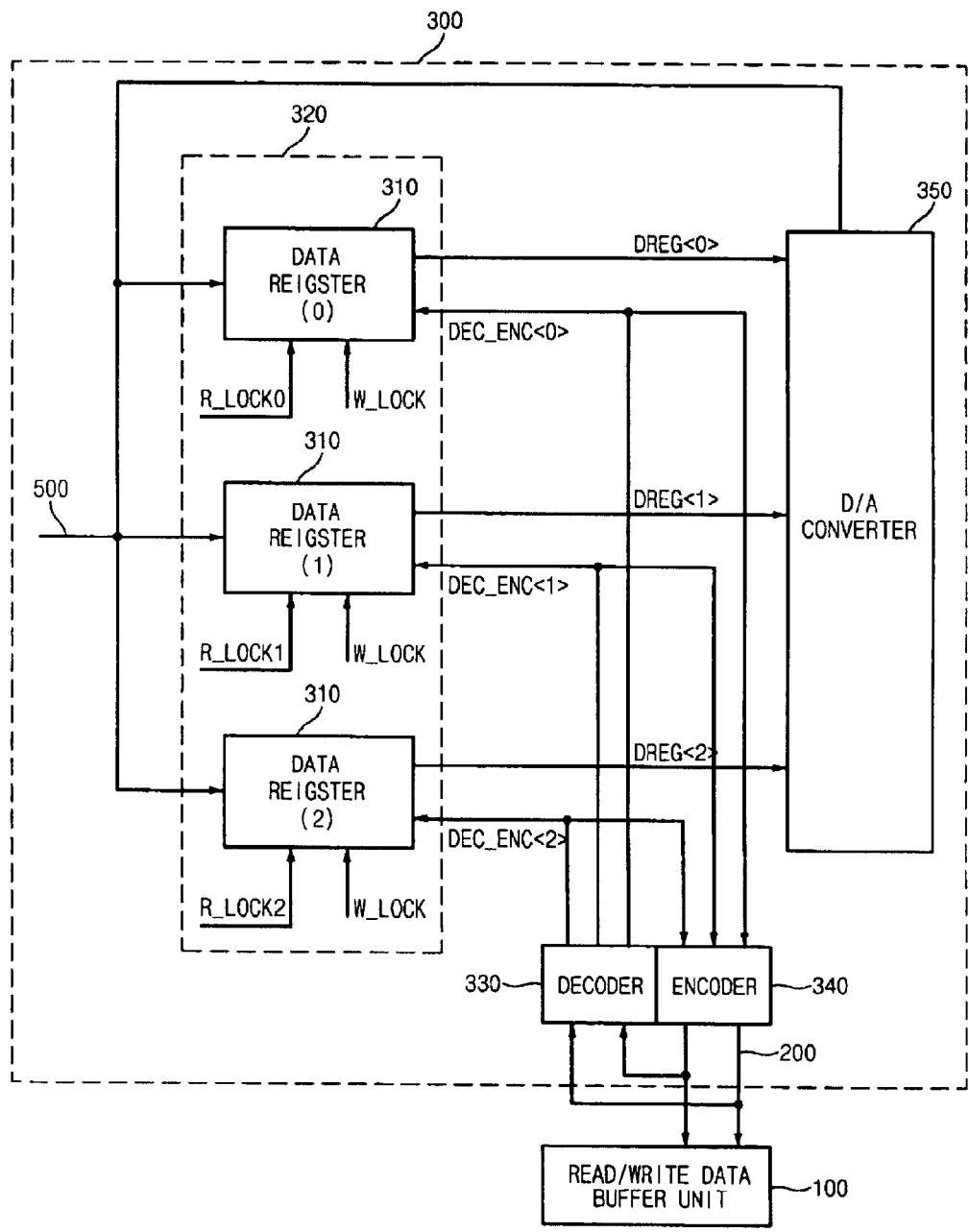
FIG. 9 is a diagram of a data register array unit of FIG. 1.

FIG. 9 is a diagram of the data register array unit 300 of FIG. 1.

The data register array unit 300 comprises a data register unit 320 a decoder 330, an encoder 340 and a D/A (Digital/Analog) converter 350.

The data register unit 320 comprises a plurality of data registers 310. The data register unit 320 latches and stores a plurality of sensing data levels applied from the common data bus unit 500 in response to the read lock signals R_LOCK0~R_LOCK2. The data register unit 320 outputs data register signals DREG<0:2> into the D/A converter 350 in response to a write lock signal W_LOCK in order to restore read data. The data register unit 320 stores coding signals DEC_ENC<0:2> applied from the decoder 330, and outputs coding signals DEC_ENC<0:2> stored in the encoder 340.

The data register array unit 300 comprises the three data register 310 to process 2 bit data. Four data sensing levels are compared with three sensing critical voltages, and the comparison results are stored in the three data register 310, respectively. The comparison time of the three sensing critical voltages is determined by the enable time of the read lock signals R_LOCK0~R_LOCK2.

The decoder 330 decodes input data applied from the read/write data buffer unit 100 through the data buffer bus unit 200, and outputs coding signals DEC_ENC<0:2> into the data register array unit 320. The encoder 340 encodes the coding signals DEC_ENC<0:2> applied from the data register array unit 320, and outputs the encoded signals into the read/write data buffer unit 100 through the data buffer bus unit 200.

The D/A converter 350 converts the plurality of data register signals DREG<0:2> applied from the data register array unit 320 into analog signals, and outputs the converted analog signals into the common data bus unit 500.

Figure 10:
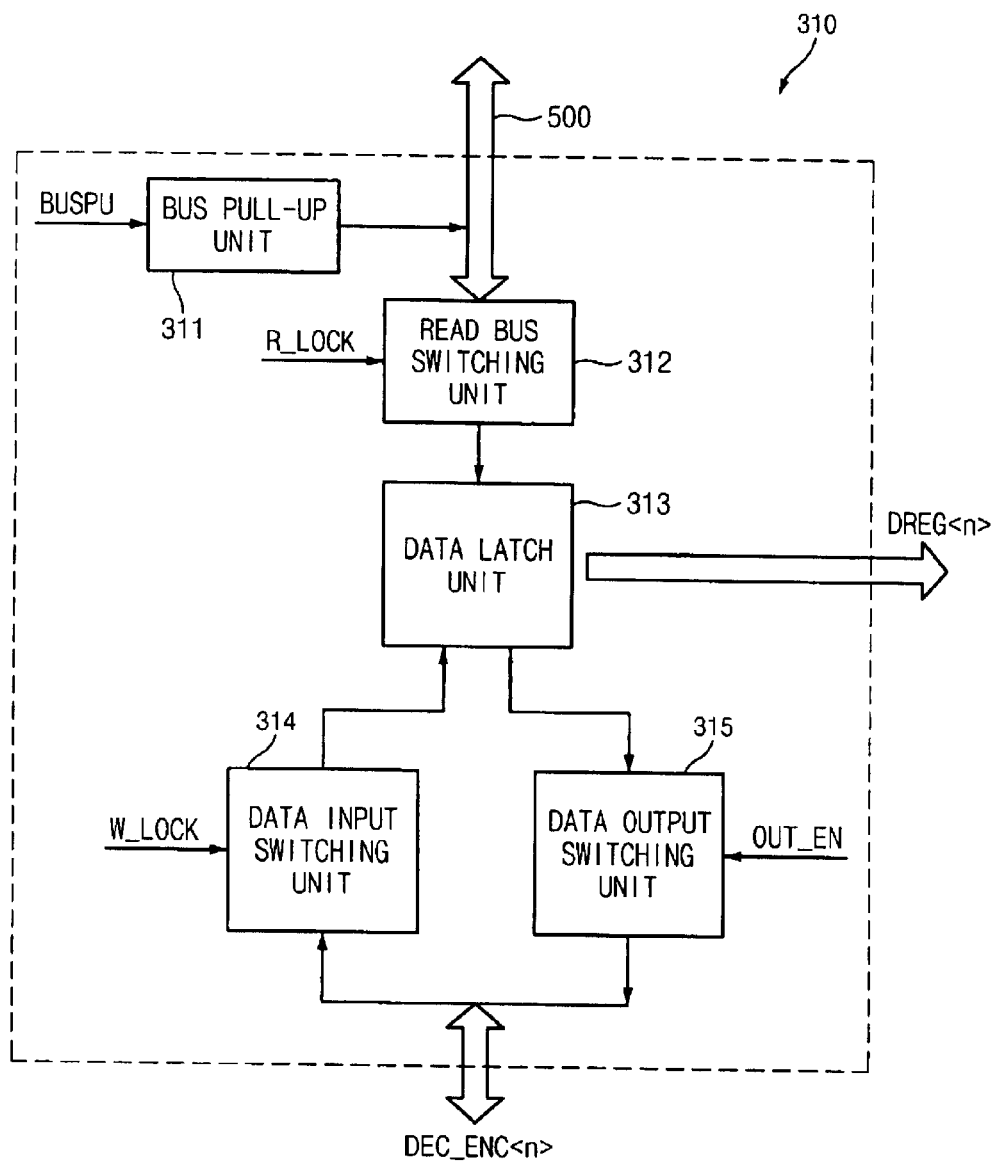
FIG. 10 is a diagram of a data register of FIG. 9.

FIG. 10 is a diagram of the unit data register 310 in the data register array unit 300 of FIG. 9.

The data register 310 comprises a bus pull-up unit 311, a read bus switching unit 312, a data latch unit 313, a data input switching unit 314, and a data output switching unit 315.

During the precharge mode, the bus pull-up unit 311 pulls up the common data bus unit 500 from an initial stage in response to a bus pull-up signal BUSPU. The read bus switching unit 312 outputs read data applied from the common data bus unit 500 into the data latch unit 313 in response to a read lock signal R_LOCK. The data latch unit 313 stores read data applied from the read bus switching unit 312 and input data applied from the data input switching unit 314 and outputs data register signal DREG<n>.

In the write mode the data input switching unit 314 outputs coding signals DEC_ENC<n> applied from a decoder 330 into the data latch unit 313 in response to a write lock signal W_LOCK. The data output switching unit 315 outputs data applied from the data latch unit 313 as data register signal DREG<n> into the D/A converter 350 in response to an output enable signal OUT_EN.

In the read mode, the data register array unit 300 stores cell data applied from the common data bus unit 500 in the data latch unit 313 through the read bus switching unit 312. The data stored in the data latch unit 313 are outputted into the data buffer bus unit 200 through the data output switching unit 315. Also, the data stored in the data latch unit 313 are feedback outputted as data register signals DREG<n> into the D/A converter 350, and used to restore destroyed data.

In the write mode, data applied from the data buffer bus unit 200 are stored in the data latch unit 313 through the data input switching unit 314.

Figure 11:
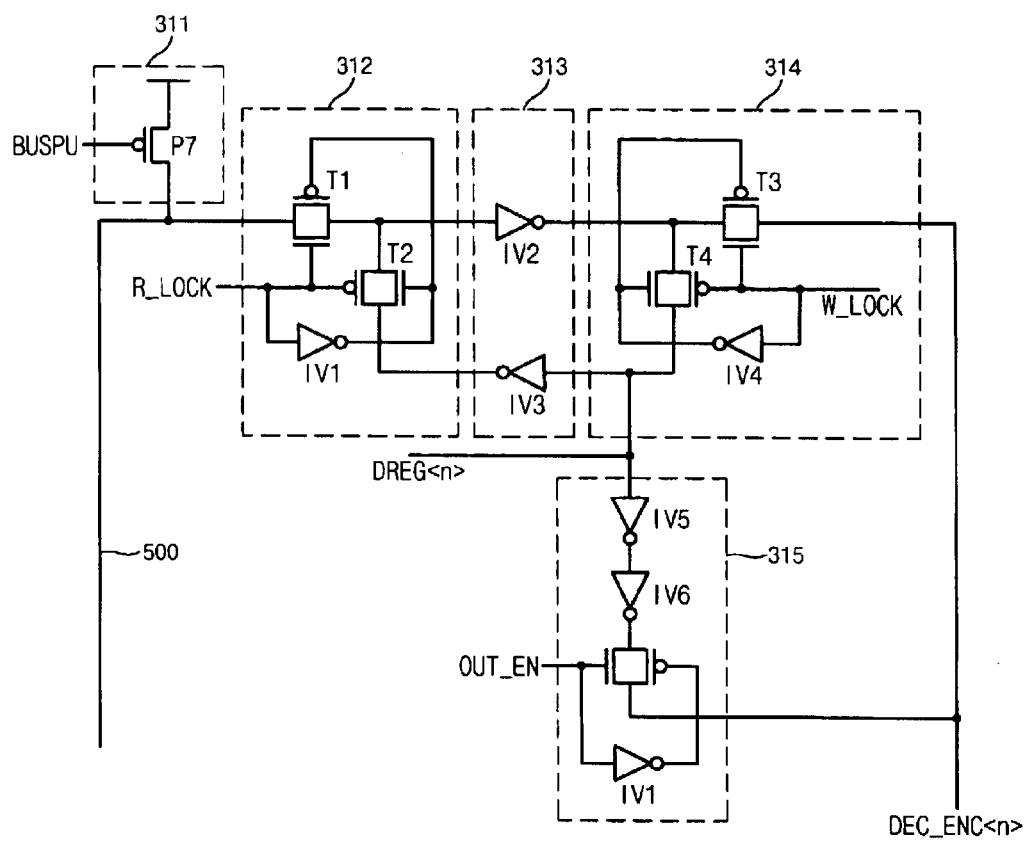
FIG. 11 is a circuit diagram of a data register of FIG. 10.

FIG. 11 is a circuit diagram of the data register 310 of FIG. 10.

The bus pull-up unit 311 comprises a PMOS transistor P7 connected between a power voltage terminal and the common data bus unit 500. The PMOS transistor P7 pulls up the common data bus unit 500 in response to the bus pull-up signal BUSPU.

The read bus switching unit 312 comprises transmission gates T1 and T2, and an inverter IV1. The inverter IV1 inverts a read lock signal R_LOCK. The transmission gate T1 selectively outputs read dada applied from the common data bus unit 500 in response to the read lock signal R_LOCK. The transmission gate T2 selectively outputs an output signal from the inverter IV3 in response to the read lock signal R_LOCK.

The data latch unit 313 comprises inverters IV2 and IV3 connected with a latch type.

The data input switching unit 314 comprises an inverter IV4 and transmission gates T3 and T4. The inverter IV4 inverts a write lock signal W_LOCK. The transmission gate T3 selectively outputs an output signal from the inverter IV4 in response to the write lock signal W_LOCK. The transmission gate T4 selectively outputs an output signal from the data buffer bus unit 200 into the data latch unit 313 in response to the write lock signal W_LOCK.

The data output switching unit 315 comprises inverters IV5~IV7, and a transmission gate T5. The inverters IV5 and IV6 delay an output signal from the transmission gate T4. The inverter IV7 inverts an output enable signal OUT_EN. The transmission gate T5 outputs an output signal from the inverter IV6 into the data buffer bus unit 200 in response to the output enable signal OUT_EN.

Figure 12:
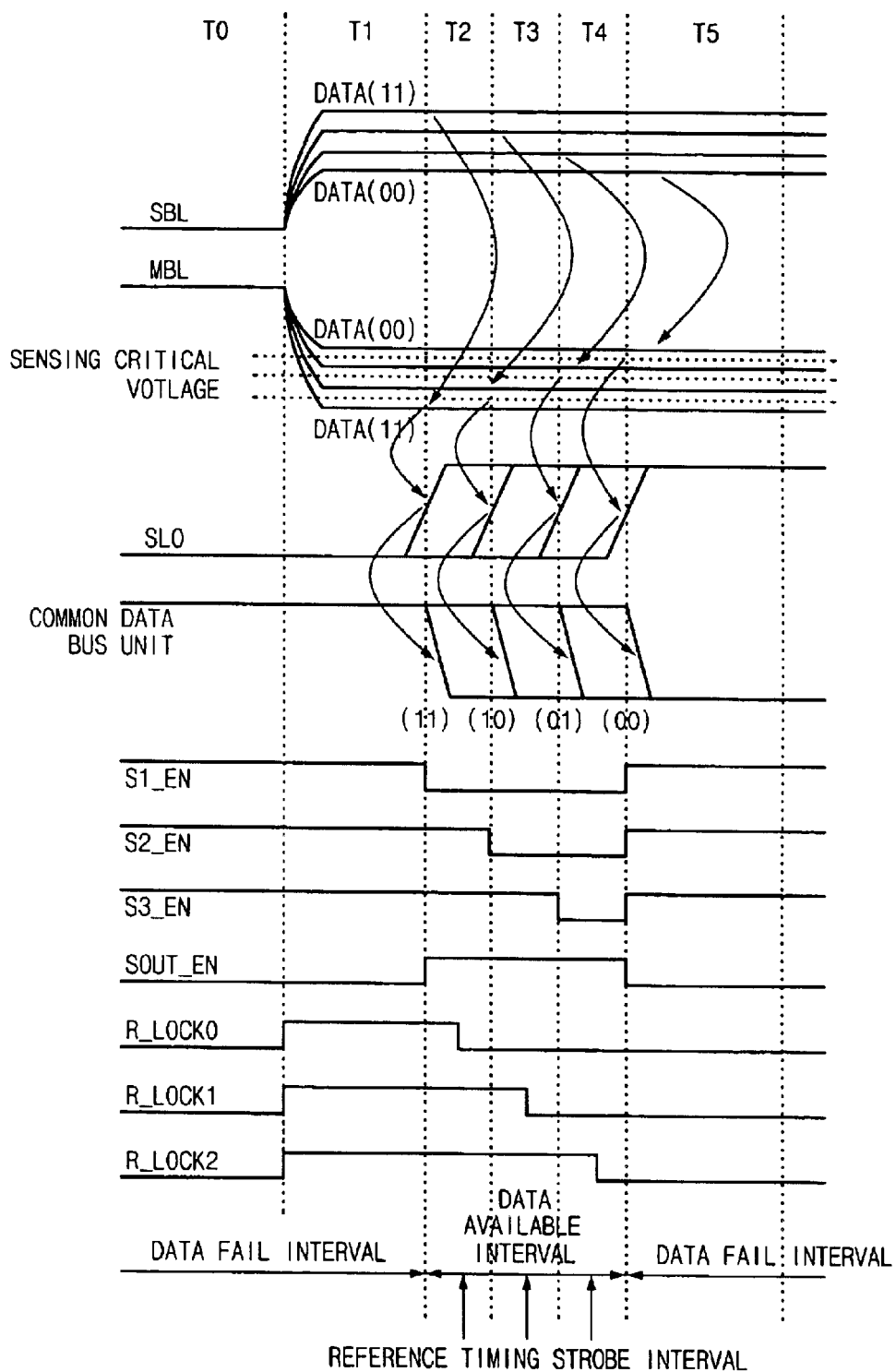
FIG. 12 is a timing diagram of a data register array unit of FIG. 9.

FIG. 12 is a timing diagram of the data register unit 320 of FIG. 9.

In an interval T1, if the read lock signal R_LOCK is enabled, the plurality of cell sensing data 00, 01, 10 and 11 are applied to the sub bitline SBL. A plurality of data sensing levels in the sub bitline SBL are separated into a plurality of main bitline MBL signals. The plurality of sensing levels applied to the main bitline MBL are compared with a plurality of sensing critical voltages set in the sense amplifier array unit 450.

In an interval T2, if the read lock signal R_LOCK0 is disabled while the sensing enable signal S1_EN is enabled, the cell sensing data 11 and 10 are distinguished and stored in the data register(0) 310.

In an interval T3, if the read lock signal R_LOCK1 is disabled while the sensing enable signals S1_EN and S2_EN are disabled, the cell sensing data 10 and 01 are distinguished and stored in the data register(1) 310.

In an interval T4, if the read lock signal R_LOCK2 is disabled while the sensing enable signals S1_EN, S2_EN and S3_EN are all disabled, the cell sensing data 01 and 00 are distinguished and stored in the data register(2) 310.

In other words, the data latch unit 313 is activated while the read lock signals R_LOCK<n> are enabled, and read data having a plurality of sensing levels applied from the common data bus unit 500 are continuously inputted into the data register unit 320. As a result, the voltage levels of the cell sensing data 00, 01, 10 and 11 which reach a plurality of sensing critical voltages during the reference timing strobe interval become different in the main bitline MBL.

While the sensing enable signals S1_EN, S2_EN and S3_EN are disabled in the reference timing strobe interval, a plurality of data sensed from the sense amplifier array unit 450 are stored in the three data registers 310. Then, if the read lock signal R_LOCK<n> transits to a low level to disconnect the read bus switching unit 312, read data are no longer inputted into the data latch unit 313. Thus, data previously stored in the data latch unit 313 are continuously maintained when the read lock signal R_LOCK<n> is disabled during the reference timing strobe interval.

Thereafter, in an interval T5, if the sensing enable signals S1_EN, S2_EN and S3_EN transits to a high level, the sense amplifier array unit 450 is inactivated, and the voltage level of the node SLO is enabled to a high level regardless of voltage levels of the plurality of cell data.

Figure 13:
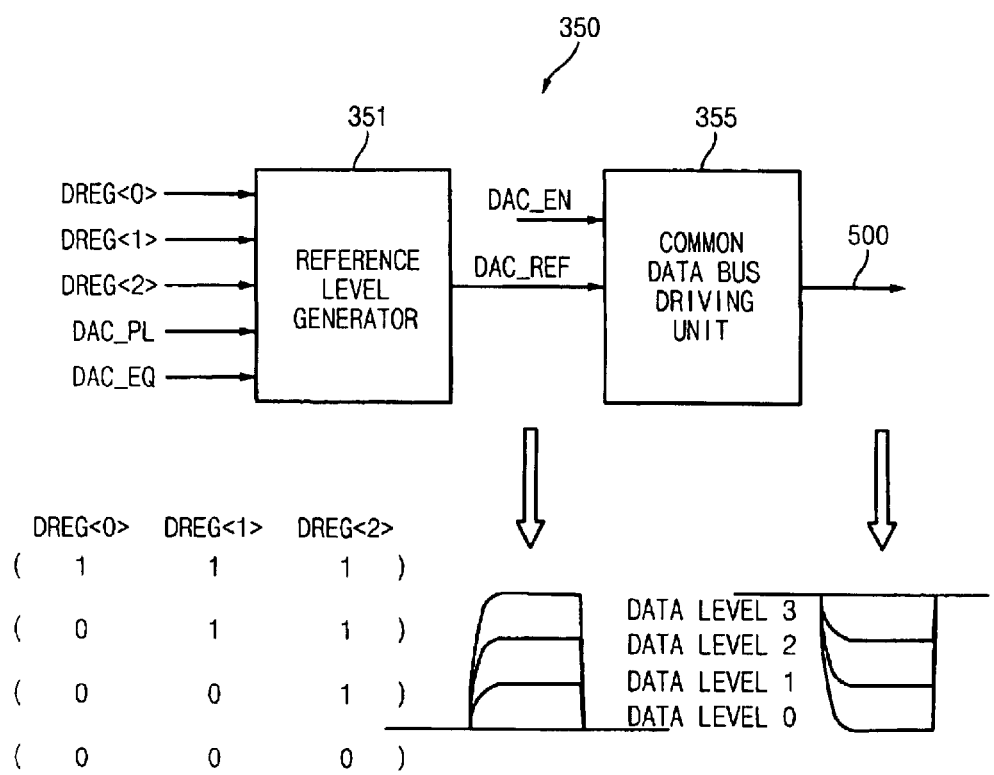
FIG. 13 is a diagram of a D/A converter of FIG. 9.

FIG. 13 is a diagram of the D/A converter 350 of FIG. 9.

The D/A converter 350 comprises a reference level generator 351 and a common data bus driving unit 355.

The reference level generator 351 outputs a reference level signal DAC_REF in response to a plurality of data register signals DREG<0:2> applied from the data register unit 320, a plateline control signal DAC_PL and an equalizing signal DAC_EQ. The reference level generator 351 generates 4 cell recording voltage levels using three data register signals DREG<0:2> to process 2 bit data.

The reference level generator 351 outputs the reference level signal DAC_REF having a data level "3" when the data register signals DREG<0:2> are all "1". The reference level generator 351 outputs the reference level signal DAC_REF having a data level "2" when the data register signal DREF<0> is "0" and the other data register signals DREF<1> and DREF<2> are "1". The reference level generator 351 outputs the reference level signal DAC_REF having a data level "1" when the data register signal DREF<2> is "1" and the data register signals DREF<0> and DREF<1> are "0". The reference level generator 351 outputs the reference level signal DAC_REF having a data level "0" when the data register signals DREF<0:2> are all "0".

The common data bus driving unit 355 drives the reference level signal DAC_REF and outputs the driven signal DAC_REF into the common data bus unit 500.

Figure 14:
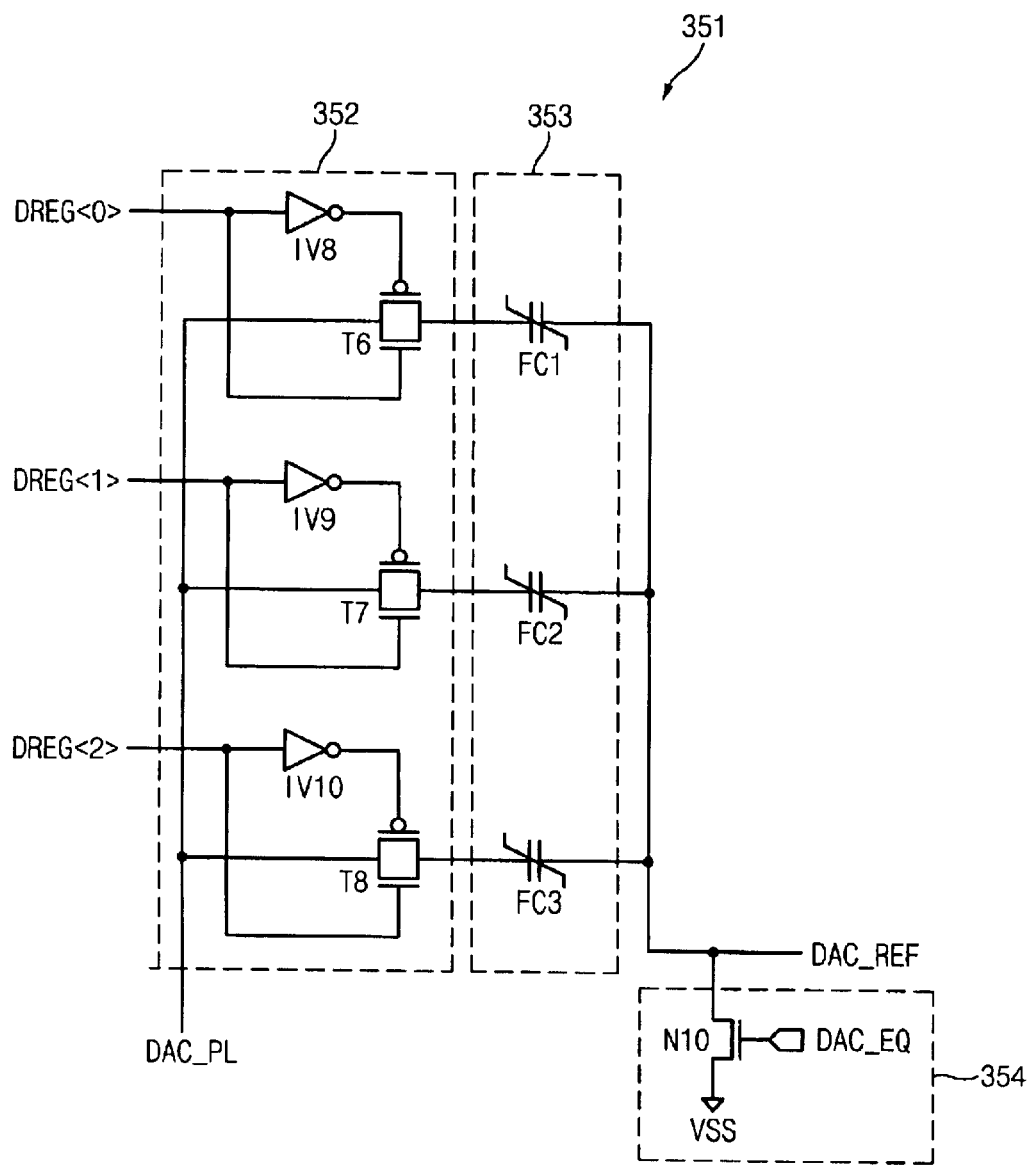
FIG. 14 is a circuit diagram of a reference level generator of FIG. 13.

FIG. 14 is a circuit diagram of the reference level generator 351 of FIG. 13.

The reference level generator 351 comprises a switching unit 352, a capacitor regulator 353 and a precharge controller 354.

The switching unit 352 comprises a plurality of inverters IV8~IV10, and a plurality of transmission switches T6~T8. The capacitor regulator 353 comprises a plurality of nonvolatile ferroelectric capacitors FC1~FC3. The precharge controller 354 comprises an NMOS transistor N10. The NMOS transistor N10, connected between a reference level signal DAC_REF output terminal and a ground voltage VSS terminal, has a gate to receive an equalizing signal DAC_EQ.

The inverters IV8~IV10 in the switching unit 352 invert a plurality of data register signals DREG<0:2> applied from the data register unit 320. The transmission gates T6~T8 selectively outputs a plateline control signal DAC_PL in response to the plurality of data register signals DREG<0:2>.

The nonvolatile ferroelectric capacitors FC1~FC3 controls a data voltage level of the reference level signal DAC_REF by selectively regulating the size of the capacitor outputted in response to output signals from the transmission gates T6~T8, respectively.

During the precharge interval, the equalizing signal DAC_EQ becomes at a high level, and the NMOS transistor N10 is turned on to precharge the reference level signal DAC_REF to a low level.

Figure 15:
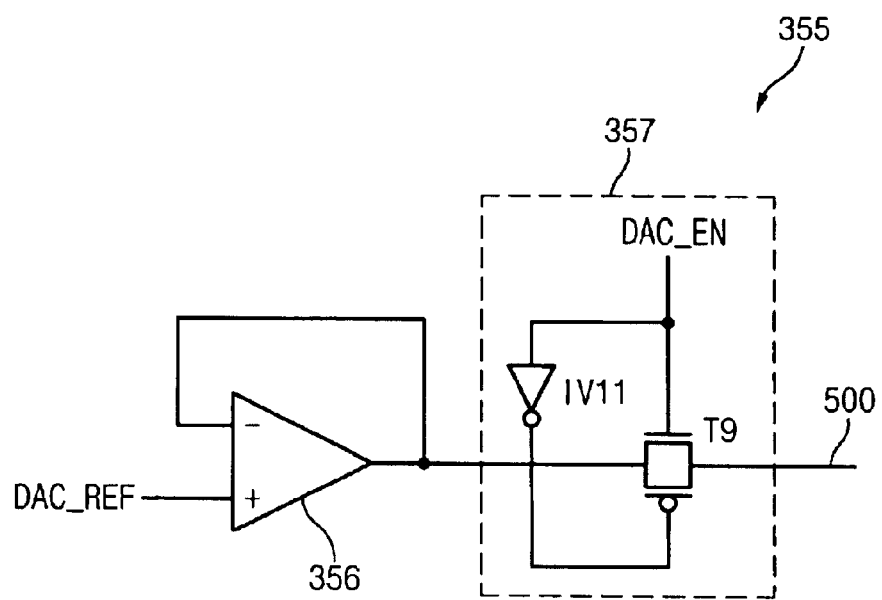
FIG. 15 is a circuit diagram of a common data bus driving unit of FIG. 13.

FIG. 15 is a circuit diagram of the common data bus driving unit 355 of FIG. 3.

The common data bus driving unit 355 comprises a buffer 356 and a driving unit 357. The buffer 356 amplifies a current driving capacity of the reference level signal DAC_REF. Here, the voltage of the reference level signal DAC_REF is the same as that of the common data bus unit 500.

The driving unit 357 comprises an inverter IV11 and a transmission gate T9. The driving unit 357 selectively outputs an output signal from the buffer 356 into the common data bus unit 500 in response to the driving enable signal DAC_EN enabled only in the write mode.

Figure 16:
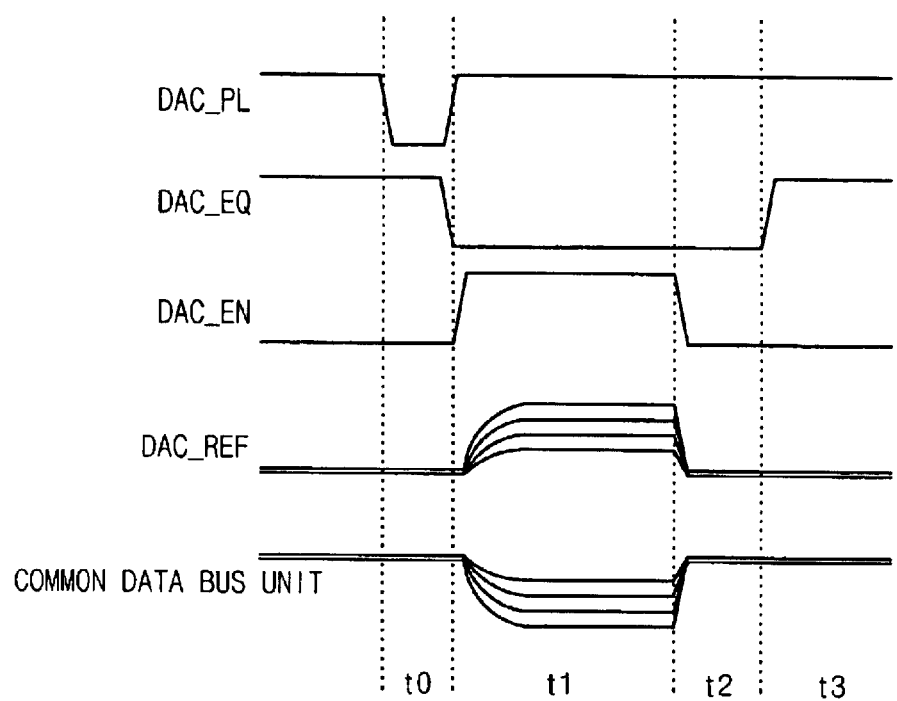
FIG. 16 is a timing diagram of the D/A converter of FIG. 9.

FIG. 16 is a timing diagram of the D/A converter 350 of FIG. 13.

In an interval t0, the plateline control signal DAC_PL transits to a low level, and is maintained at a high level after an interval t1. As a result, noise charge is removed of the capacitor regulator 353. In addition, the equalizing signal DAC_EQ becomes at a high level, thereby initializing the capacitor regulator 353 to a low level.

When the interval t1 starts, the equalizing signal DAC_EQ transits to a low level. The driving enable signal DAC_EN is enabled during the write mode of the interval t1 in order to write data in the cell array block 400 or 402 through the common data bus unit 500. The voltage level of the reference level signal DAC_REF is determined in response to the plurality of data register signals DREG<0:2>.

In other words, when the plurality of data register signals DREG<0:2> are all at a high level, the voltage level of the plateline control signal DAC_PL is applied to the three nonvolatile ferroelectric capacitors FC1~FC3 of the capacitor regulator 353. As a result, the reference level signal DAC_REF is outputted with the highest voltage level.

On the other hand, when the plurality of data register signals DREG<0:2> are all at a low level, the voltage level of the plateline control signal DAC_PL is not applied to the nonvolatile ferroelectric capacitors FC1~FC3 of the capacitor regulator 353. As a result, the reference level signal DAC_REF is outputted with the lowest voltage level.

In the initial operation, since the common data bus unit 500 is precharged to a high level, the reference level signal DAC_REF is written in the write mode.

Meanwhile, $2^n$ level data are required to store n bits in a memory cell. For example, $4(=2^2)$ level data is required to store 2 bits in a memory cell. That is, data levels of 00, 01, 10 and 11 are required. Thus, in order to store data of four levels in a cell, a voltage level is divided into VW0 (VPP), VW1, VW2 and VW3 (VSS), and stored.

Hereinafter, the write operation of 2 bit data is described.

If a VW0(VPP) voltage is applied to a cell while the plateline PL is at the ground voltage VSS level, hidden data "1" is written in all cells.

Next, when a pumping voltage VPP is applied to the plateline PL, a voltage VW1 is applied to the sub bitline SBL and the main bitlines MBL to store a data level 10. As a result, a voltage VW0~VW1 is applied to the plateline PL and the sub bitline SBL. That is, the charge initially stored in the cell is reduced to that corresponding to the voltage VW0-VW1. Thus, a data level 11 transits to the data level 10.

Thereafter, data levels 01 and 00 are stored in the cell by applying different voltages VW2 and VW3 to the sub bitline SBL and the main bitline MBL.

The sensing voltage of the sub bitline SBL is represented by $2^n$ data levels 111, 110, . . . , 001 and 000. The $2^n$ data levels are compared and amplified with $2^n-1$ reference levels.

In the read mode, when data are sensed, $2^n-1$ output signals from the sense amplifier array unit 450 are encoded in the encoder 340, and n input/output data are outputted into the read/write data buffer unit 100. In the write or restore mode, the output signals from the encoder 340 are feedback inputted into the decoder 330. As a result, the output signals from the decoder 330 are converted into analog signals in the D/A converter 350, and the D/A converter 350 outputs voltages VW0, VW1, . . . having $2^n$ write/restore levels.

Figure 17:
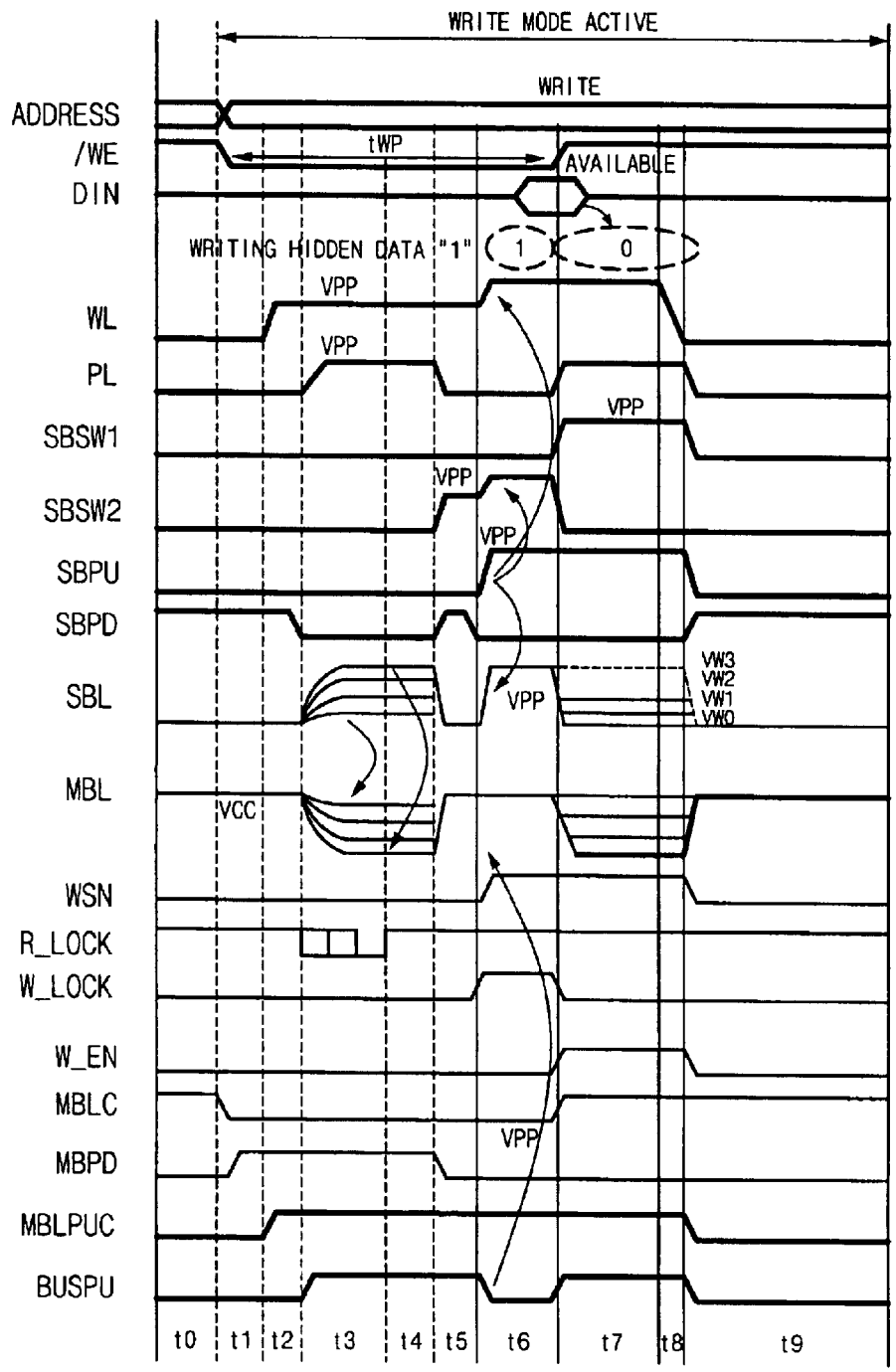
FIG. 17 is a timing diagram illustrating the write mode of the nonvolatile ferroelectric memory device having a multi-bit control function.

FIG. 17 is a timing diagram illustrating the write mode of the nonvolatile ferroelectric memory device having a multi-bit control function.

When the interval t1 starts, if a write enable signal /WE is disabled to a low level, the write operation becomes active. Here, the main bitline control signal MBLC is disabled to a low level, and the main bitline pull-down signal MBPD is enabled to a high level.

Thereafter, when an interval t2 starts, the wordline WL is enabled to a pumping voltage VPP, and the main bitline pull-up control signal MBLPUC is enabled.

Next, when an interval t3, the plateline PL is enabled to the pumping voltage VPP level, and the sub bitline pull-down signal SBPD is disabled. As a result, cell data are applied to the main bitline MBL. Then, the read lock signals R_LOCK are sequentially disabled to latch a plurality of cell sensing data. Here, the bus pull-up signals BUSPU is enabled to stop the precharge operation of the common data bus unit 500.

When an interval t4 starts, the read lock signal R_LOCK is enabled to a high level, and new cell data applied from the common data bus unit 500 are inputted.

When an interval t5 starts, the plate line PL is disabled to a low level, and the sub bitline selecting signal SBSW2 is enabled to a high level. Then, the sub bitline pull-down signal SBPD is enabled to a high level, and the sub bitline SBL and the main bitline pull-down signal MBPD is disabled to a low level.

In an interval t6, hidden data "1" is written. When the interval t6 starts, the voltage of the wordline WL rises, and the sub bitline selecting signal SBSW2 is enabled to the pumping voltage VPP level in response to the sub bitline pull-up signal SBPU. As a result, the voltage level of the sub bitline SBL rises to the pumping voltage VPP level.

Here, if the write switching signal WSN is enabled, the main bitline MBL is connected to the common data bus unit 500. Then, the write lock signal W_LOCK is enabled, and data stored in the data latch unit 313 are stored in the memory cell. The bus pull-up signal BUSPU becomes at a low level to precharge the common data bus unit 500.

In an interval t7, multi-level data can be written in response to the write enable signal /WE. When the interval t7 starts, the plateline PL is enabled to the high level again. Then, the sub bitline selecting signal SBSW1 rises to the pumping voltage VPP level, and the sub bitline selecting signal SBSW2 is disabled. Here, the main bitline control signal MBLC and the bus pull-up signal BUSPU are enabled to a high level.

Therefore, while the sub bitline selecting signal SBSW1 is at the pumping voltage VPP level, a plurality of data can be written in the memory cell depending on multi-voltages VW0~VW3 levels applied to the sub bitline SBL and the main bitline MBL.

When an interval t8 starts, the wordline WL is disabled. Thereafter, when an interval t9 starts, the plateline PL, the sub bitline selecting signal SBSW1 and the sub bitline pull-up signal SBPU are disabled. Then, the sub bitline pull-down signal SBPD is enabled, and the main bitline pull-up control signal MBLPUC is disabled. As a result, the main bitline MBL is precharged to the power voltage VCC level. Here, the write switching signal WSN is disabled to disconnect the common data bus unit 500 to the main bitline MBL.

Figure 18:
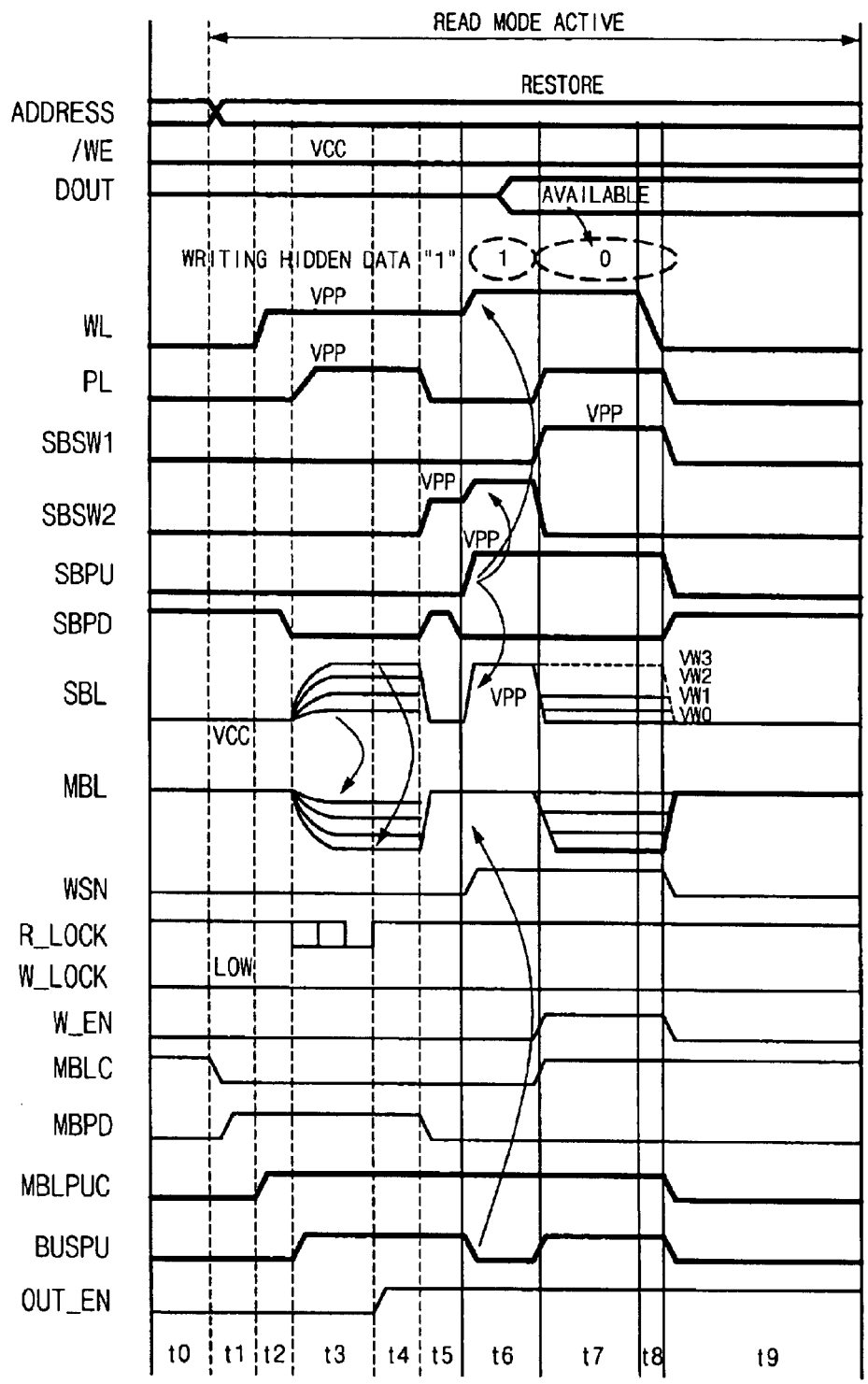
FIG. 18 is a timing diagram illustrating the read mode of the nonvolatile ferroelectric memory device having a multi-bit control function.

FIG. 18 is a timing diagram illustrating the read mode of the nonvolatile ferroelectric memory device having a multi-bit control function.

In the read mode, the write enable signal /WE is maintained at the power voltage VCC level. In the interval t3 and t4, data are sensed. In the interval t6, hidden data "1" is written, and a data output available interval is maintained after the interval t7.

The cell array block 400 does not write input data externally inputted through the timing data buffer unit 100 in the cell. Instead, the cell array block 400 restores read data stored in the data register array unit 300 in the cell.

Thereafter, in the interval t7, a plurality of multiple level data are restored. That is, while the sub bitline selecting signal SBSW1 is at a high level, multiple levels of the voltages VW0~VW3 are applied to the sub bitline SBL and the main bitline MBL by a feedback decoder loop. As a result, the multiple levels are restored in the memory cell.

During the interval t7, a plurality of data levels stored in the cell array block 400 are sensed, and outputted through the common data bus unit 500.

As described above, in a nonvolatile ferroelectric memory device according to an embodiment of the present invention, a plurality of data bits are stored in a cell, thereby improving the sensing margin. Additionally, a plurality of read/written data are stored through a register, thereby embodying a chip having an improved data access time. As a result, the chip having a low power voltage or a rapid access time can be embodied, thereby securing the margin of the sensing voltage and improving the operation speed.

What is claimed is:

1. A nonvolatile ferroelectric memory device having a multi-bit function, comprising:

a plurality of cell array blocks for generating a plurality of different sensing critical voltages in a reference timing strobe interval, and for comparing the plurality of sensing critical voltages with a plurality of cell data sensing voltages applied from a main bitline, wherein each of the plurality of cell array blocks comprises a nonvolatile ferroelectric memory;

a data register array unit for storing the plurality of bit data applied from the plurality of cell array blocks in different timing intervals and for converting a plurality of inputted bit data or the plurality of bit data into analog reference level signals; and a common data bus unit, connected in common to the plurality of cell array blocks, for controlling data exchange between the plurality of cell array blocks and the data register array unit.

2. The device according to claim 1, wherein each of the plurality of cell array blocks comprises:

a main bitline pull-up controller for pulling up the main bitline in response to a main bitline pull-up control signal;

a main bitline sensing load unit for controlling sensing load of the main bitline in response to a main bitline control signal;

a plurality of sub cell arrays each comprising the nonvolatile ferroelectric memory;

a write switching unit for selectively connecting the common data bus unit to the main bitline in response to a write switching signal; and a sense amplifier array unit for generating the plurality of sensing critical voltages in response to a plurality of sensing enable signals activated consecutively in the different timing intervals, and for comparing the plurality of sensing critical voltages with the plurality of cell data sensing voltages applied from the common data bus unit.

3. The device according to claim 2, wherein the sense amplifier array unit comprises:

a multi-level sensing unit for comparing the plurality of cell data sensing voltages with the plurality of sensing critical voltages generated in response to the plurality of sensing enable signals, and for outputting a plurality of detecting voltage levels into an output node; and a sensing output unit for outputting a plurality of cell data into the common data bus unit depending on a voltage level of the output node when a sensing output enable signal is activated.

4. The device according to claim 3, wherein the multi-level sensing unit comprises:

a sensing voltage regulator for regulating a voltage level outputted to the output node depending on a selective enable state of the plurality of sensing enable signals; and a first driver for controlling the amount of current applied to the output node depending on voltage levels of cell data applied from the main bitline.

5. The device according to claim 4, wherein the sensing voltage regulator comprises a plurality of PMOS transistors which are connected in parallel between a power voltage terminal and the output node and sequentially turned on in response to the plurality of sensing enable signals.

6. The device according to claim 4, wherein the first driver comprises a first NMOS transistor which is connected between the output node and a ground voltage terminal and has a gate connected to the main bitline.

7. The device according to claim 3, wherein the sensing output unit comprises:

a second driver for outputting a ground voltage when the sensing output enable signal is activated; and a third driver for determining a voltage level of the common data bus unit depending on a voltage level of the output node.

8. The device according to claim 7, wherein the second driver comprises a second NMOS transistor which is connected between the third driver and a ground voltage terminal and has a gate to receive the sensing output enable signal.

9. The device according to claim 7, wherein the third driver comprises a third NMOS transistor which is connected between the common data bus unit and the second driver and has a gate connected to the output node.

10. The device according to claim 1, wherein the data register array unit comprises:
a data register unit for storing the plurality of sensing data levels applied from the common data bus unit depending on sequential activation of a plurality of read lock signals activated at different timings in different time interval, and for outputting a plurality of data register signals;
a decoder for decoding input data applied from a read/write data buffer unit through a data buffer bus unit, and for outputting a plurality of coding signals into the data register unit;
an encoder for encoding the plurality of coding signals applied from the data register unit, and for outputting the encoded signals into the data buffer bus unit; and
a D/A converter for converting the plurality of data register signals into analog reference level signals, and for outputting the converted signals into the common data bus unit.

11. The device according to claim 10, wherein the data register unit comprises a plurality of unit data registers, and each of the plurality of unit data registers comprises:
a bus pull-up unit for pulling up the common data bus unit to a power voltage in response to a bus pull-up signal;
a read bus switching unit for outputting a sensing data level applied from the common data bus unit when a read lock signal is activated;
a data latch unit for storing the sensing data level applied from the read bus switching unit, and outputting a data register signal;
a data input switching unit for outputting a coding signal applied from the data buffer bus unit into the data latch unit when a write lock signal is activated; and
a data output switching unit for outputting a coding signal applied from the data latch unit into the encoder when an output enable signal is activated.

12. The device according to claim 10, wherein the D/A converter comprises:
a reference level generator for controlling a voltage level of the reference level signal by regulating the size of a nonvolatile ferroelectric capacitor depending on voltage levels of the plurality of data register signals; and
a common data bus driver for buffering and driving the reference level signal in a write mode, and for outputting the buffered and driven signal into the common data bus unit.

13. The device according to claim 12, wherein the reference level generator comprises:
a switching unit for selectively outputting a plateline control signal depending on voltage levels of the plurality of data register signals;
a capacitor regulator comprising a plurality of nonvolatile ferroelectric capacitors, the regulator for controlling a data voltage level of the reference level signal by selectively regulating a size of a capacitor in response to the plateline control signal; and
a precharge controller for precharging the reference level signal to a low level when an equalizing signal is enabled to a high level in a precharge mode.

14. The device according to claim 13, wherein the switching unit comprises a plurality of transmission gates for outputting the plateline control signal when the plurality of data register signals are inputted with a high level, the plurality of transmission gates corresponding to the number of data register signals.

15. The device according to claim 12, wherein the common data bus driver comprises:
a buffer for amplifying and driving current of the reference level signal; and
a driving unit for outputting an output signal from the buffer into the common data bus unit when a driving enable signal activated in a write mode is enabled.

16. A nonvolatile ferroelectric memory device having a multi-bit control function, comprising:
a plurality of cell array blocks;
a data register array unit for sequentially storing a plurality of cell data sensing voltages applied from the plurality of cell array blocks through a common data bus unit;
each of the plurality of cell array blocks comprises a sense amplifier array unit for generating a plurality of sensing critical voltages in response to a plurality of sensing enable signals having a predetermined time interval activated sequentially in a reference timing strobe interval, and for comparing the plurality of cell data sensing voltages applied from the common data bus unit with the plurality of sensing critical voltages.

17. The device according to claim 16, wherein the sense amplifier array unit comprises:
a multi-level sensing unit for comparing the plurality of cell data sensing voltages with the plurality of sensing critical voltages generated in response to the plurality of sensing enable signals, and for outputting a plurality of sensing voltage levels into an output node; and
a sensing output unit for outputting a plurality of cell data into the common data bus unit depending on a voltage level of the output node when a sensing output enable signal is activated.

18. The device according to claim 17, wherein the multi-level sensing unit comprises:
a sensing voltage regulator for regulating a voltage level outputted to the output node depending on a selective enable state of the plurality of sensing enable signals; and
a first driver for controlling the amount of current applied to the output node depending on voltage levels of cell data applied from a main bitline.

19. The device according to claim 18, wherein the sensing voltage regulator comprises a plurality of PMOS transistors which are connected in parallel between a power the voltage terminal and the output node and are sequentially turned on in response to the plurality of sensing enable signals.

20. The device according to claim 17, wherein the sensing output unit comprises:
a second driver for outputting a ground voltage when the sensing output enable signal is activated; and
a third driver for determining a voltage level of the common data bus unit depending on a voltage level of the output node.

* * * * *